United States Patent
Sturza et al.

(10) Patent No.: US 11,634,041 B2
(45) Date of Patent: Apr. 25, 2023

(54) ACCESS COVER DETECTION CIRCUIT FOR ELECTRIFIED VEHICLE COMPONENT AND CORRESPONDING METHOD

(71) Applicant: Ford Global Technologies, LLC, Dearborn, MI (US)

(72) Inventors: John Sturza, Royal Oak, MI (US); Philip Michael Gonzales, Dearborn, MI (US); Abdul Lateef, Canton, MI (US); Charles Honick, Canton, MI (US); Stephanie Singer, Berkley, MI (US); Suriyaprakash Ayyangar Janarthanam, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 715 days.

(21) Appl. No.: 16/575,566

(22) Filed: Sep. 19, 2019

(65) Prior Publication Data

US 2021/0086630 A1 Mar. 25, 2021

(51) Int. Cl.
| | |
|---|---|
| *B60L 53/16* | (2019.01) |
| *H01R 13/447* | (2006.01) |
| *H01R 13/703* | (2006.01) |
| *H01L 31/04* | (2014.01) |
| *H01L 31/08* | (2006.01) |

(52) U.S. Cl.
CPC ............ *B60L 53/16* (2019.02); *H01R 13/447* (2013.01); *H01R 13/7031* (2013.01); *H01L 31/04* (2013.01); *H01L 31/08* (2013.01)

(58) Field of Classification Search
CPC ... B60L 53/16; H01R 13/447; H01R 13/7031; H01L 31/04; H01L 31/08
USPC .......................................................... 320/104
See application file for complete search history.

(56) References Cited

U.S. PATENT DOCUMENTS

| | | | | |
|---|---|---|---|---|
| 5,696,433 | A * | 12/1997 | Patino | H01M 10/4257 429/90 |
| 7,642,747 | B2 * | 1/2010 | Morioka | H02J 7/0031 320/112 |
| 9,947,972 | B2 * | 4/2018 | Ozawa | H01M 50/20 |
| 2010/0019730 | A1 * | 1/2010 | Chueh | H02J 7/0031 320/135 |
| 2010/0079105 | A1 * | 4/2010 | Iwanaga | B60L 50/16 320/109 |
| 2010/0312920 | A1 * | 12/2010 | Johnson | H04M 1/24 710/14 |
| 2015/0340794 | A1 | 11/2015 | Gonzales et al. | |

FOREIGN PATENT DOCUMENTS

| | | | | |
|---|---|---|---|---|
| CN | 102414936 A | * | 4/2012 | ............ B60K 6/365 |
| CN | 102414936 B | * | 9/2014 | ............ B60K 6/365 |
| CN | 204290286 U | | 4/2015 | |
| CN | 109748182 B | * | 12/2020 | |

(Continued)

*Primary Examiner* — Suresh Memula
(74) *Attorney, Agent, or Firm* — David B. Kelley; Carlson, Gaskey & Olds, P.C.

(57) ABSTRACT

This disclosure relates to an access cover detection circuit for an electrified vehicle component and a corresponding method. An exemplary component of an electrified vehicle includes an access cover configured to selectively open and close relative to the component, and a circuit configured to indicate whether the access cover is open. The circuit includes a light sensitive electronic component.

12 Claims, 4 Drawing Sheets

(56) References Cited

FOREIGN PATENT DOCUMENTS

| | | | | |
|---|---|---|---|---|
| CN | 112519702 A | * | 3/2021 | .............. B60L 53/16 |
| DE | 102019213055 A1 | * | 3/2021 | |
| KR | 102205584 B1 | * | 1/2021 | |
| WO | 2018160659 A1 | | 9/2018 | |

* cited by examiner

ACCESS COVER DETECTION CIRCUIT FOR ELECTRIFIED VEHICLE COMPONENT AND CORRESPONDING METHOD

TECHNICAL FIELD

This disclosure relates to an access cover detection circuit for an electrified vehicle component and a corresponding method.

BACKGROUND

The need to reduce automotive fuel consumption and emissions is well known. Therefore, vehicles are being developed that reduce or completely eliminate reliance on internal combustion engines. Electrified vehicles are one type of vehicle being developed for this purpose. In general, electrified vehicles differ from conventional motor vehicles because they are selectively driven by battery powered electric machines. Conventional motor vehicles, by contrast, rely exclusively on an internal combustion engine to propel the vehicle.

SUMMARY

A component of an electrified vehicle according to an exemplary aspect of the present disclosure includes, among other things, an access cover configured to selectively open and close relative to the component, and a circuit configured to indicate whether the access cover is open. The circuit includes a light sensitive electronic component.

In a further non-limiting embodiment of the foregoing component, the light sensitive electronic component is a light dependent resistor.

In a further non-limiting embodiment of any of the foregoing components, the component includes an electrical connector, and the access cover is configured to selectively close to cover the electrical connector.

In a further non-limiting embodiment of any of the foregoing components, the electrical connector is one of a busbar and a cable.

In a further non-limiting embodiment of any of the foregoing components, the light dependent resistor is arranged adjacent the electrical connector.

In a further non-limiting embodiment of any of the foregoing components, the circuit includes a transistor arranged in parallel with the light dependent resistor, the transistor is configured to turn on such that a voltage output is detectable when the access cover is closed, and the transistor is configured to turn off such no voltage is detectable when the access cover is opened.

In a further non-limiting embodiment of any of the foregoing components, the transistor is a PNP transistor.

In a further non-limiting embodiment of any of the foregoing components, the circuit includes a resistor in series with the light dependent resistor.

In a further non-limiting embodiment of any of the foregoing components, the circuit includes an output terminal in series with the transistor.

In a further non-limiting embodiment of any of the foregoing components, the component includes a controller configured to prevent current from flowing through an electrical connector when the circuit indicates the access cover is open. The controller is in electronic communication with the output terminal.

In a further non-limiting embodiment of any of the foregoing components, the controller is further configured to issue one or both of a prompt on a human-machine interface and a diagnostic code.

In a further non-limiting embodiment of any of the foregoing components, the component is one of a battery pack, inverter motor controller, and a motor.

An electrified vehicle according to an exemplary aspect of the present disclosure includes, among other things, a component including an access cover configured to selectively open and close relative to the component, and a circuit configured to indicate whether the access cover is open. The circuit includes a light sensitive electronic component.

In a further non-limiting embodiment of the foregoing electrified vehicle, the light sensitive electronic component is a light dependent resistor.

In a further non-limiting embodiment of any of the foregoing electrified vehicles, the circuit includes a transistor arranged in parallel with the light dependent resistor, the transistor is configured to turn on such that a voltage output is detectable when the access cover is closed, and the transistor is configured to turn off such no voltage is detectable when the access cover is opened.

A method according to an exemplary aspect of the present disclosure includes, among other things, preventing current from flowing through an electrical connector when a circuit including a light sensitive electronic component indicates an access cover adjacent the electrical connector has opened.

In a further non-limiting embodiment of the foregoing method, the method includes permitting current to flow through the electrical connector when the circuit indicates the access cover has closed.

In a further non-limiting embodiment of any of the foregoing methods, the light sensitive electronic component is a light dependent resistor.

In a further non-limiting embodiment of any of the foregoing methods, the circuit includes a transistor arranged in parallel with the light dependent resistor, the transistor is configured to turn on such that a voltage output is detectable when the access cover is closed, and the transistor is configured to turn off such no voltage output is detectable when the access cover is opened.

In a further non-limiting embodiment of any of the foregoing methods, the step of preventing current from flowing is performed when no voltage output is detectable, and the step of permitting current to flow is performed when the voltage output is detectable.

DETAILED DESCRIPTION

This disclosure relates to an access cover detection circuit for an electrified vehicle component and a corresponding method. An exemplary component of an electrified vehicle includes an access cover configured to selectively open and close relative to the component, and a circuit configured to indicate whether the access cover is open. The circuit includes a light sensitive electronic component. The circuit reliably indicates whether the access cover is open. Information from the circuit can thus be used when deciding to take actions to disable electronic components adjacent the access cover such that service and/or maintenance can be performed with confidence. These and other benefits will be appreciated from the below description.

Figure 1:
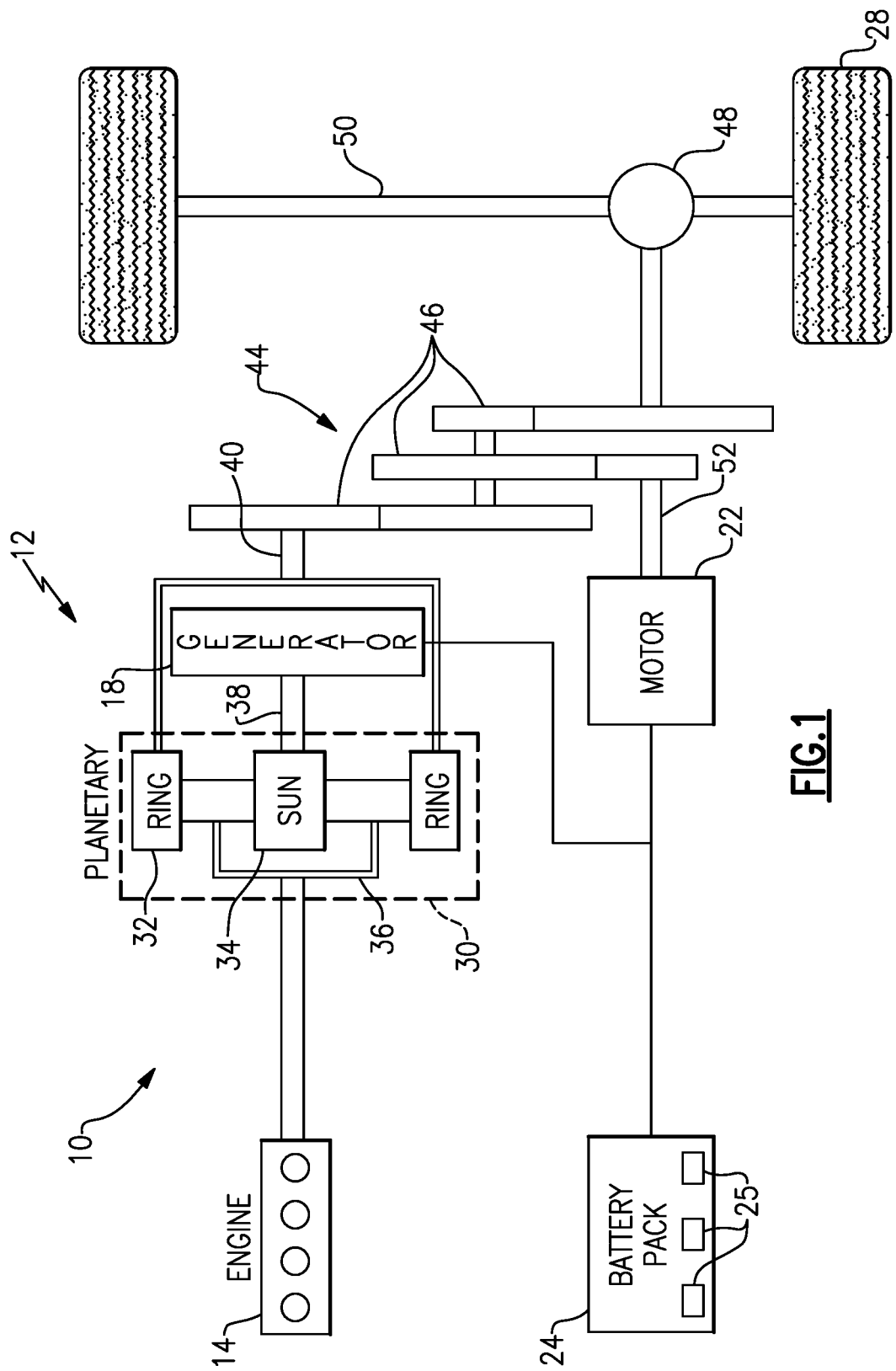
FIG. 1 schematically illustrates an example powertrain of an electrified vehicle.

FIG. 1 schematically illustrates a powertrain 10 for an electrified vehicle 12. Although depicted as a hybrid electric vehicle (HEV), it should be understood that the concepts described herein are not limited to HEVs and could extend to other electrified vehicles, including, but not limited to, plug-in hybrid electric vehicles (PHEVs) and battery electric vehicles (BEVs).

In one embodiment, the powertrain 10 is a power-split powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery assembly 24. In this example, the second drive system is considered an electric drive system of the powertrain 10. The first and second drive systems generate torque to drive one or more sets of vehicle drive wheels 28 of the electrified vehicle 12. Although a power-split configuration is shown, this disclosure extends to any hybrid or electric vehicle including full hybrids, parallel hybrids, series hybrids, mild hybrids or micro hybrids.

The engine 14, which in one embodiment is an internal combustion engine, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In one embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery assembly 24.

The battery assembly 24 is an exemplary electrified vehicle battery. The battery assembly 24 may be a high voltage traction battery pack that includes a plurality of battery assemblies 25 (i.e., battery arrays or groupings of battery cells) capable of outputting electrical power to operate the motor 22, the generator 18, and/or other electrical loads of the electrified vehicle 12. Other types of energy storage devices and/or output devices can also be used to electrically power the electrified vehicle 12.

In one non-limiting embodiment, the electrified vehicle 12 has two basic operating modes. The electrified vehicle 12 may operate in an Electric Vehicle (EV) mode where the motor 22 is used (generally without assistance from the engine 14) for vehicle propulsion, thereby depleting the battery assembly 24 state of charge up to its maximum allowable discharging rate under certain driving patterns/cycles. The EV mode is an example of a charge depleting mode of operation for the electrified vehicle 12. During EV mode, the state of charge of the battery assembly 24 may increase in some circumstances, for example due to a period of regenerative braking. The engine 14 is generally OFF under a default EV mode but could be operated as necessary based on a vehicle system state or as permitted by the operator.

The electrified vehicle 12 may additionally operate in a Hybrid (HEV) mode in which the engine 14 and the motor 22 are both used for vehicle propulsion. The HEV mode is an example of a charge sustaining mode of operation for the electrified vehicle 12. During the HEV mode, the electrified vehicle 12 may reduce the motor 22 propulsion usage in order to maintain the state of charge of the battery assembly 24 at a constant or approximately constant level by increasing the engine 14 propulsion usage. The electrified vehicle 12 may be operated in other operating modes in addition to the EV and HEV modes within the scope of this disclosure.

Figure 2:
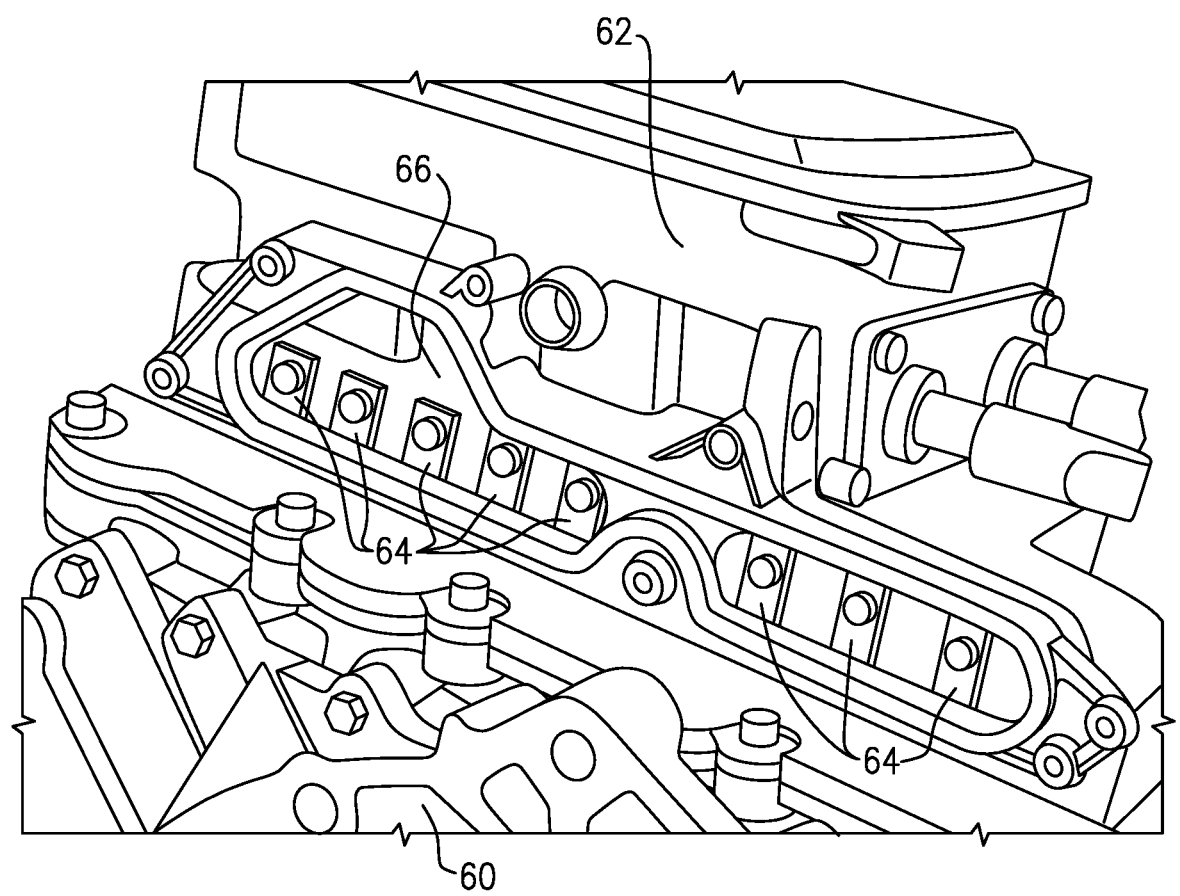
FIG. 2 illustrates first and second components of the electrified vehicle.

FIG. 2 illustrates two components of the electrified vehicle 12 which are electronically connected together. In FIG. 2, a first component 60 is electronically connected to a second component 62 via a plurality of electrical connectors 64. The electrical connectors 64 are arranged at least partially in an access opening, or cavity, 66 within the second component 62 in this example. The electrical connectors 64 are busbars in this example, but this disclosure extends to other types of electrical connectors 64 including cables and wire harnesses. The electrical connectors 64 are high voltage electrical connectors in this example. While multiple electrical connectors 64 are shown in FIG. 2, this disclosure extends to arrangements with one or more electrical connectors.

The access opening 66 is selectively covered by an access cover 68 (FIG. 3), which is configured to selectively open and close relative to the access opening 66. When open, the electrical connectors 64 may be accessed by the access opening 66. When closed, the electrical connectors 64 and access opening 66 are covered by the access cover 68, which in this example forms an air and water tight seal relative to the second component 62. The access cover 68 may be affixed to the second component 62 using a number of threaded fasteners and/or seals, for example. The access cover 68 may need to be removed in order to access the electrical connectors 64 for service and/or maintenance, as examples.

In FIG. 2, the first component 60 is the motor 22 and the second component 62 is an inverter motor controller. The first and second components 60, 62 may be other electronic or electromechanical components of the electrified vehicle 12, however, including the battery assembly 24, generator 18, DC-to-DC converter, and others. This disclosure extends to any two electronic or electromechanical components which are electronically connected together, and in particular extends to such components with high voltage connections.

Figure 3:
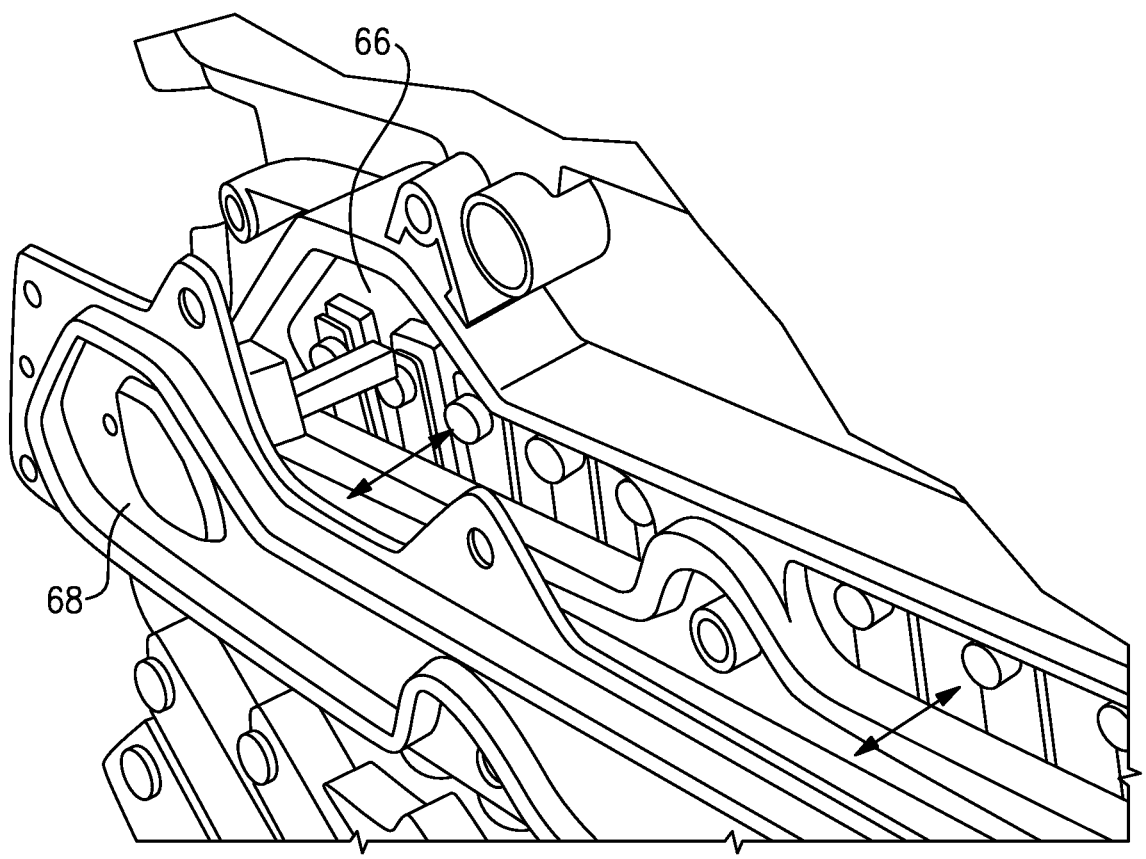
FIG. 3 illustrates an access cover relative to an access opening.

This disclosure includes a circuit configured to detect when the access cover 68 is open, as is shown in FIG. 3. In this sense, the circuit may be referred to as an access cover detection circuit. While illustrated relative to the second component 62, other components of the electrified vehicle may have access openings, covers, and circuits substantially similar to those described herein.

The aforementioned circuit is configured to produce a different output when the access cover 68 is open than when the access cover 68 is closed. Accordingly, the output can be interpreted by a controller, for example, and used to disable various components of the electrified vehicle 12 such that current does not flow through the electrical connectors 64 when the access cover 68 is open. Thus, maintenance and service can be performed adjacent the access opening 66 with confidence.

Figure 4:
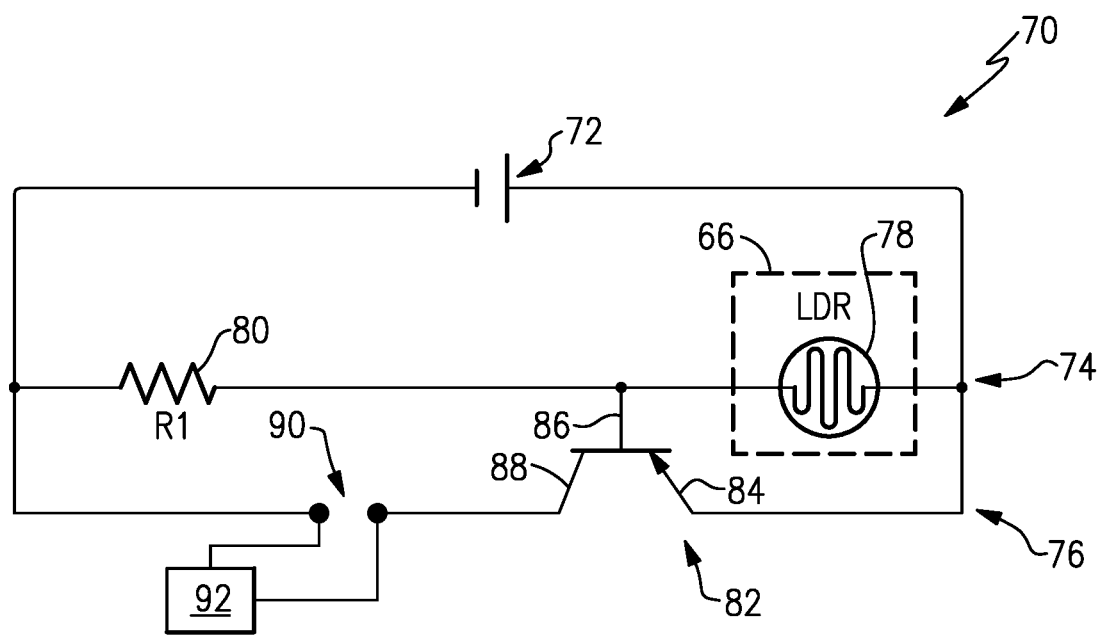
FIG. 4 illustrates an example circuit.

FIG. 4 illustrates an example circuit 70 configured to indicate whether the access cover 68 is open. The circuit 70 includes a power source 72, which may be an automotive battery, such as a 12V automotive battery or another relatively low voltage power source. The power source 72 is not the battery assembly 24 in this example. The circuit 70 includes first and second channels 74, 76 arranged in parallel with the power source 72.

The first channel 74 includes a light dependent resistor 78. While a light dependent resistor 78 is shown in this example, this disclosure extends to circuits with other types of light sensitive electronic components including photo-emissive cells, photo-conductive cells, photo-voltaic cells, photo-junction cells, and/or light activated switches.

The light dependent resistor 78 is sometimes referred to as a photoresistor, and is a light-controlled variable resistor. The resistance of the light dependent resistor 78 decreases with increasing light intensity and vice versa. The light dependent resistor 78 is arranged adjacent the electrical connectors 64 and in the access opening 66, in one example. The light dependent resistor 78 may be arranged anywhere that would be exposed to light once the access cover 68 opens. The first channel 74 further includes a resistor 80 in series with the light dependent resistor 78.

The second channel 76 includes a transistor 82 having three terminals, namely an emitter 84, base 86, and collector 88. The transistor 82 is a semiconductor device which functions as a switch in this example. The example transistor 82 is a PNP transistor, but it could be configured as an NPN transistor. The transistor 82 permits current to flow to the first channel 74 via the base 86 when the transistor 82 is off. Specifically, when the transistor 82 is off, the transistor 82 permits current to flow from the emitter 84 to the base 86, and not from the emitter 84 to the collector 88. The transistor 82 permits current to flow to an output terminal 90 when the transistor 82 is on. Specifically, when the transistor 82 is on, the transistor 82 permits current to flow from the emitter 84 to the collector 88, and not from the emitter 84 to the base 86. The output terminal 90 is in series with the transistor 82 and is in a location in the circuit 76 where a voltage reading may be taken. In one example a controller 92 is in electronic communication with the output terminal 90 and is configured to take the voltage reading.

The controller 92 is shown schematically in FIG. 4. It should be understood that the controller 92 could be part of an overall vehicle control module, such as a vehicle system controller (VSC), or could alternatively be a stand-alone controller separate from the VSC. Further, the controller 92 may be programmed with executable instructions for interfacing with and operating the various components of the electrified vehicle 12. The controller 92 may additionally include a processing unit and non-transitory memory for executing the various control strategies and modes of the vehicle system. The controller 92 may also be flash memory controller and/or a programmable logic array.

In use, when the access cover 68 is closed, the access opening 66 is substantially if not completely dark and thus the light dependent resistor 78 resistance is relatively high, and thus the transistor 82 will turn on and permit current to flow through the second channel 76 such that a voltage is detected at the output terminal 90. On the other hand, when the access cover 68 is open, the resistance of the light dependent resistor 78 is relatively low, and thus the transistor 82 will turn off and prevent current from flowing through the second channel 76 such that no voltage is detectable at the output terminal 90. In response to a drop in voltage the output terminal 90 or a reading of no voltage at the output terminal 90, the controller 92 may take certain actions, including one or more of (1) disabling the first and second electronic components 60, 62 such that current is prevented from flowing through the electrical connectors 64, (2) issuing a prompt on a human-machine interface such as an instrument cluster, and/or (3) issuing a diagnostic code. While an example is described above, the circuit 70 could be configured such that a voltage detected at the output terminal 90 corresponds to the access cover 68 being open.

It should be understood that terms such as "about," "substantially," and "generally" are not intended to be boundaryless terms, and should be interpreted consistent with the way one skilled in the art would interpret those terms. It should also be understood that directional terms are used herein relative to the normal operational attitude of a vehicle for purposes of explanation only, and should not be deemed limiting.

Although the different examples have the specific components shown in the illustrations, embodiments of this disclosure are not limited to those particular combinations. It is possible to use some of the components or features from one of the examples in combination with features or components from another one of the examples. In addition, the various figures accompanying this disclosure are not necessarily to scale, and some features may be exaggerated or minimized to show certain details of a particular component or arrangement.

One of ordinary skill in this art would understand that the above-described embodiments are exemplary and non-limiting. That is, modifications of this disclosure would come within the scope of the claims. Accordingly, the following claims should be studied to determine their true scope and content.

The invention claimed is:

1. A component of an electrified vehicle, comprising:
   an access cover configured to selectively open and close relative to the component; and
   a circuit configured to indicate whether the access cover is open, wherein the circuit includes a light sensitive electronic component,
   wherein the light sensitive electronic component is a light dependent resistor,
   wherein the circuit includes a transistor arranged in parallel with the light dependent resistor, wherein the transistor is configured to turn on such that a voltage output is detectable when the access cover is closed, wherein the transistor is configured to turn off such no voltage is detectable when the access cover is opened, and wherein the circuit includes a resistor in series with the light dependent resistor.

2. The component as recited in claim 1, further comprising an electrical connector, and wherein the access cover is configured to selectively close to cover the electrical connector.

3. The component as recited in claim 2, wherein the electrical connector is one of a busbar and a cable.

4. The component as recited in claim 2, wherein the light dependent resistor is arranged adjacent the electrical connector.

5. The component as recited in claim 1, wherein the transistor is a PNP transistor.

6. The component as recited in claim 1, wherein the circuit includes an output terminal in series with the transistor.

7. The component as recited in claim 6, further comprising a controller configured to prevent current from flowing through an electrical connector when the circuit indicates the access cover is open, and wherein the controller is in electronic communication with the output terminal.

8. The component as recited in claim 7, wherein the controller is further configured to issue one or both of a prompt on a human-machine interface and a diagnostic code.

9. The component as recited in claim 1, wherein the component is one of a battery pack, inverter motor controller, and a motor.

10. An electrified vehicle, comprising:
a component including an access cover configured to selectively open and close relative to the component, and a circuit configured to indicate whether the access cover is open, wherein the circuit includes a light sensitive electronic component, wherein the light sensitive electronic component is a light dependent resistor, wherein the circuit includes a transistor arranged in parallel with the light dependent resistor, wherein the transistor is configured to turn on such that a voltage output is detectable when the access cover is closed, wherein the transistor is configured to turn off such no voltage is detectable when the access cover is opened, and wherein the circuit includes a resistor in series with the light dependent resistor.

11. A method, comprising:
preventing current from flowing through an electrical connector when a circuit including a light sensitive electronic component indicates an access cover adjacent the electrical connector has opened;

permitting current to flow through the electrical connector when the circuit indicates the access cover has closed, wherein the light sensitive electronic component is a light dependent resistor, wherein the circuit includes a transistor arranged in parallel with the light dependent resistor, wherein the transistor is configured to turn on such that a voltage output is detectable when the access cover is closed, wherein the transistor is configured to turn off such no voltage output is detectable when the access cover is opened, and wherein the circuit includes a resistor in series with the light dependent resistor.

12. The method as recited in claim 11, wherein the step of preventing current from flowing is performed when no voltage output is detectable, and wherein the step of permitting current to flow is performed when the voltage output is detectable.

* * * * *